(12) United States Patent
Borel et al.

(10) Patent No.: US 8,541,313 B2
(45) Date of Patent: Sep. 24, 2013

(54) METHOD FOR ETCHING A SACRIFICIAL LAYER FOR A MICRO-MACHINED STRUCTURE

(75) Inventors: Stéphan Borel, St. Martin d'Heres (FR); Jeremy Bilde, Seyssinet Pariset (FR)

(73) Assignee: Commissariat a l'Energie Atomique, Paris (FR)

( * ) Notice: Subject to any disclaimer, the term of this patent is extended or adjusted under 35 U.S.C. 154(b) by 891 days.

(21) Appl. No.: 12/090,212

(22) PCT Filed: Oct. 25, 2006

(86) PCT No.: PCT/EP2006/067763
§ 371 (c)(1),
(2), (4) Date: Sep. 4, 2008

(87) PCT Pub. No.: WO2007/048805
PCT Pub. Date: May 3, 2007

(65) Prior Publication Data
US 2009/0124088 A1    May 14, 2009

(30) Foreign Application Priority Data
Oct. 27, 2005  (FR) ..................... 05 53271

(51) Int. Cl.
*B81C 1/00* (2006.01)
*B81C 3/00* (2006.01)
*B81B 7/00* (2006.01)

(52) U.S. Cl.
USPC ........... 438/738; 438/706; 438/735; 438/737; 438/740; 438/52; 438/53; 216/2; 216/41; 216/46; 216/51; 216/58; 216/72; 216/74; 216/79; 216/62; 117/97

(58) Field of Classification Search
CPC ................. B81C 1/00476; B81C 1/00484
USPC .............. 438/737, 52, 53, 706, 735, 738, 438/740; 216/2, 62, 72, 41, 46, 51, 58, 74, 216/79; 117/97
See application file for complete search history.

(56) References Cited

U.S. PATENT DOCUMENTS 6,159,385 A * 12/2000 Yao et al. ............... 216/2
6,440,766 B1 * 8/2002 Clark .................. 438/52

(Continued)

OTHER PUBLICATIONS

S. Borel et al., "Isotropic Etching of SiGe Alloys with High Selectivity to Similar Material", Microelectronic Engineering, vol. 73/74, pp. 301-305 (2004).*
Borel et al., "Isotropic Etching of SIGE Alloys With High Selectivity to Similar Materials", Microelectronic Engineering, vol. 73 to 74, pp. 301 to 305, 2004.
Williams, Kirt R. et al., "Etch Rates for Micromachining Processing", Journal of Microelectromechanical Systems, vol. 5, No. 4, pp. 256 to 269, 1996.

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

A method of etching a sacrificial layer for a micro-machined structure, the sacrificial layer positioned between a layer of a first material and a layer of a second material, the etching being carried out by an etching agent. The method includes: providing at least one species having an affinity for the etching agent greater than that of the layers of first material and second material and less than or equal to that of the sacrificial layer; and then etching the sacrificial layer by the etching agent, the etching being carried out to eliminate at least partially the sacrificial layer and then to eliminate at least partially the species.

4 Claims, 3 Drawing Sheets

U.S. PATENT DOCUMENTS

| | | | |
|---|---|---|---|
| 6,873,088 B2 * | 3/2005 | Skotnicki et al. | 310/328 |
| 7,411,261 B2 * | 8/2008 | Lee et al. | 257/415 |
| 2001/0003269 A1 * | 6/2001 | Wu et al. | 117/94 |
| 2003/0138986 A1 * | 7/2003 | Bruner | 438/52 |
| 2004/0245586 A1 * | 12/2004 | Partridge et al. | 257/414 |
| 2008/0217653 A1 * | 9/2008 | Sonsky | 257/190 |

* cited by examiner

METHOD FOR ETCHING A SACRIFICIAL LAYER FOR A MICRO-MACHINED STRUCTURE

TECHNICAL FIELD

The invention concerns a method of etching a sacrificial layer for a micro-machined structure. It generally applies to all cases where a buried sacrificial layer must be removed selectively so as to create a cavity between its two adjoining layers.

STATE OF THE PRIOR ART

The reduction of dimensions in certain devices, such as those of microelectronics, leads to the appearance of parasitic effects that limit performance. To circumvent this problem, new architectures have been envisaged. The manufacture of such original structures sometimes makes use of unusual materials associated with novel methods. Some of these methods use a sacrificial layer to obtain a cavity or to free a crossarm or a membrane for example. It is also possible to replace the sacrificial layer by a layer of another material.

FIGS. 1A to 1C are schematic diagrams illustrating a method of the prior art using a sacrificial layer. These figures are side views. This method enables for example a structure comprising a substrate in silicon supporting successively a layer of $SiO_2$ (of 20 nm thickness for example) and a layer of silicon (of 15 nm thickness for example) to be obtained. Since it is not possible to obtain this stack directly, use is made of a sacrificial layer of SiGe that enables the growth of the layer of silicon and which is then replaced by the layer of oxide. This layer of oxide can in this way enable the channel of a transistor formed in the superficial layer of silicon to be electrically isolated from the substrate.

FIG. 1A represents a stack comprising a substrate in silicon 11 supporting successively a layer of SiGe 12 and a layer of silicon 13. The layer of SiGe is then eliminated by etching. The structure represented in FIG. 1B is obtained where, on a part of the structure (that visible in FIG. 1B), the layer 13 is separated from the substrate 11 by a recess or tunnel 14. At this stage of the method, the structure obtained is of the SON (Silicon on Nothing) type. By a technique combining the oxidation of the silicon and a deposition of silicon oxide, the sacrificial layer may then be replaced by a layer 15 of silicon oxide.

The materials used to obtain the previous structure necessarily have relatively similar characteristics to enable the different layers to be epitaxied, such as the chemical composition and the crystalline state (for example Si and SiGe). These materials therefore react in a similar manner to the etching method. Thus, the difficulty resides in the possibility of only etching the sacrificial layer without degrading the adjoining layers. The problem is very topical in the field of "ultimate" microelectronics where the dimensions are such that the least consumption of material cannot be disregarded. However, there is a high risk of it also being encountered in other fields such as Microsystems, where the dimensions are for the moment relaxed, but tend to use materials and methods up to now restricted to nano-devices.

In fact, once the sacrificial layer in SiGe (which may comprise 30% of Ge atoms) is etched, the surrounding silicon is itself partially etched, mainly at the tunnel inlet. Indeed, the chemistry of etching the sacrificial layer is not inert vis-à-vis the adjacent layers or substrates, which are of composition similar to the composition of the sacrificial layer. For example, a fluorine etching agent attacks SiGe, Si and Ge both reacting with fluorine. Consequently, the silicon is also partially attacked during the etching of the sacrificial layer. This consumption of silicon occurs during the etching of the sacrificial layer and during the step of over-etching (overrun of the etching time just necessary for the removal of the sacrificial layer) indispensable to assure a good uniformity of removal of the entire sacrificial layer. Indeed, it is observed that the rate of etching of the silicon increases at the moment the sacrificial layer totally disappears. This particularity is obviously also found for materials other than silicon.

FIGS. 2A to 2C illustrate what has just been described. These are also side views. FIG. 2A represents a stack comprising a substrate in silicon 21 supporting successively a layer of SiGe 22 and a layer of silicon 23. FIG. 2B shows the result obtained after the etching of the sacrificial layer 22. FIG. 2C shows the result obtained after the formation of the layer of oxide 25. The attacks of the silicon mainly take place at the ends of the tunnel 24 (see FIG. 2B).

If the selectivity provided by the method itself is not sufficient (through the etching chemistry), it is necessary to control the etching time in a very precise manner in order to avoid any over etching. This approach requires numerous successive tests in order to determine the optimal time and assumes that the uniformity is such that the etching ends at the same moment at all points of the structure, which is in all likelihood not the case.

DESCRIPTION OF THE INVENTION

The invention enables this problem of the prior art to be remedied by the use of a species having an affinity for the etching agent greater than that of the materials that do not have to be etched and less than or, if necessary, equal to that of the sacrificial layer.

The subject of the invention is therefore a method of etching a sacrificial layer for a micro-machined structure, the sacrificial layer being comprised between a layer of a first material and a layer of a second material, the etching being carried out by means of an etching agent, characterised in that it comprises:

a step of providing at least one species having an affinity for the etching agent greater than that of the layers of first material and second material and less than or equal to that of the sacrificial layer, then, a step of etching the sacrificial layer by means of the etching agent, the etching step being carried out to eliminate at least partially the sacrificial layer and then to eliminate at least partially said species.

The method according to the invention then enables firstly the sacrificial layer and secondly the added species to be etched, which makes it possible to preserve the adjoining layers.

Said species may be present on the structure in the form of a solid material. It may be constituted of the material of the sacrificial layer present in surplus. It may be constituted of a material arranged near to the sacrificial layer. Said species may be constituted of a layer of a material comprised between the sacrificial layer and at least one of either the layer of first material and the layer of second material. By way of example, the layers of first material and second material being in silicon, the sacrificial layer being in SiGe and the etching agent being a gas containing fluorine, said species may be in SiGe less rich in Ge than the sacrificial layer.

BRIEF DESCRIPTION OF DRAWINGS

The invention may best be understood and other advantages and particularities will become apparent by reference to the following description, provided as an indication only and in no way limiting and by referring to the accompanying drawings in which.

DETAILED DESCRIPTION OF SPECIFIC EMBODIMENTS

An embodiment of the present invention consists in introducing a species (or several species) having an affinity for the etching agent greater than that of the materials for which the etching is not desired, and less than that of the material to be eliminated. It is intended to solicit the etching species, directly in the form of a material present on the structure to be etched, in other words near to the materials to be preserved. The reaction with the species intended to preserve the materials not to be etched will last up to the disappearance of the sacrificial layer and will thereby prevent the etching species from attacking the layers adjoining the sacrificial layer. If the presence of the material forming the species intended to preserve the materials not to be etched is a hindrance for the remainder of the operations relative to the structure, it is possible to arrange so that this material disappears during the method according to the invention or after its implementation.

Figure 1A:
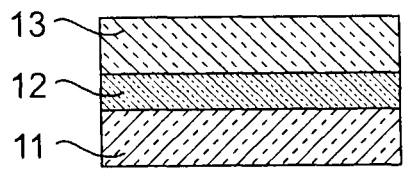
FIGS. 1A to 1C, already described, are schematic diagrams illustrating a method of the prior art using a sacrificial layer, FIGS. 2A to 2C, already described, are illustrative of etching defects caused by the method of the prior art.
Figure 2A:
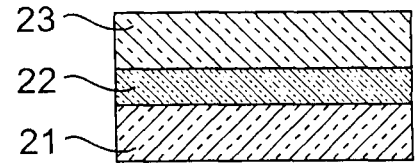
Figure 1B:
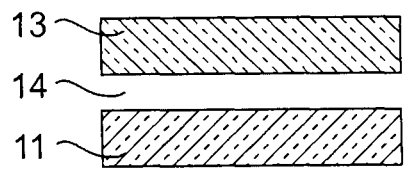
Figure 2B:
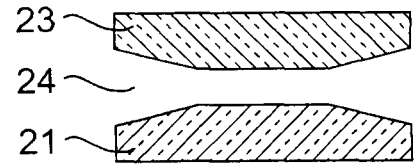
Figure 1C:
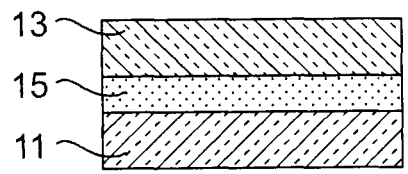
Figure 2C:
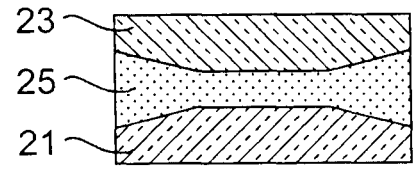
Figure 3A:
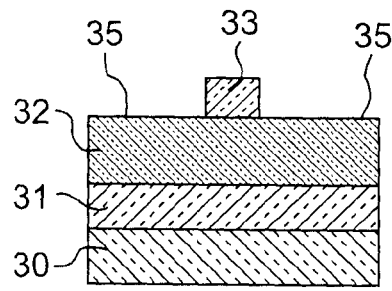
FIGS. 3A to 3C are illustrative of an alternative embodiment of the method according to the present invention.
Figure 3B:
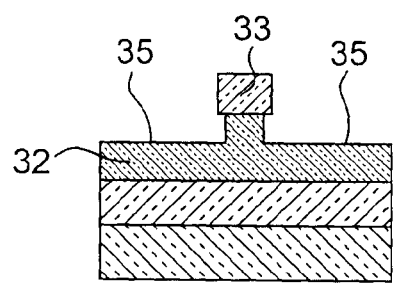
Figure 3C:
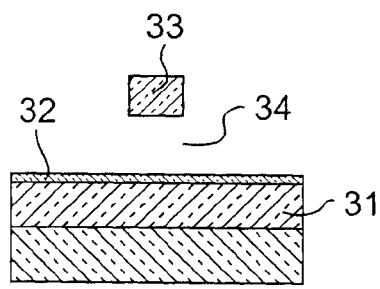

FIGS. 3A to 3C are illustrative of an alternative embodiment according to this example. This alternative applies in particular to the case where the layer supporting the sacrificial layer does not need to be treated. It is then possible to carry out the removal of the sacrificial layer both vertically and horizontally. Since the attacks are isotropic, the rate of etching is identical in both of these directions. If the width of the pattern is less than the thickness of the sacrificial layer, when the tunnel is cleared, a residue of the sacrificial layer on the lower part of the cavity will remain, this residue will prevent the layers adjacent to the sacrificial layer to begin to be etched by soliciting the etching species.

FIG. 3A shows a structure comprising a substrate 30 in silicon supporting epitaxied layers 31 in silicon, 32 in SiGe and 33 in silicon. The layer 33 is deposited on the layer 32 then etched to leave free edges 35 on the layer 32. These free edges 35 constitute a species with an affinity for the etching agent greater than that of layers 31 and 33 and equal to that of the sacrificial layer 32.

FIG. 3B shows this structure during the etching of the sacrificial layer 32. The edges 35 of the sacrificial layer 32 are etched at the same time as the tunnel is formed.

FIG. 3C shows the structure obtained once the tunnel 34 is formed. Residues of the sacrificial layer subsist, not visible in FIG. 3C, on the internal walls of the cavity.

Figure 4A:
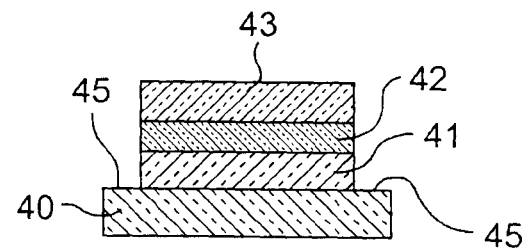
FIGS. 4A to 4C are illustrative of another alternative embodiment of the method according to the present invention.
Figure 4B:
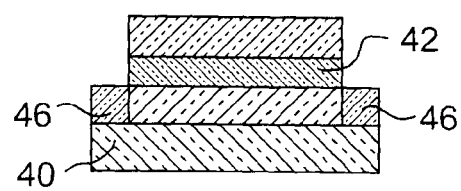
Figure 4C:
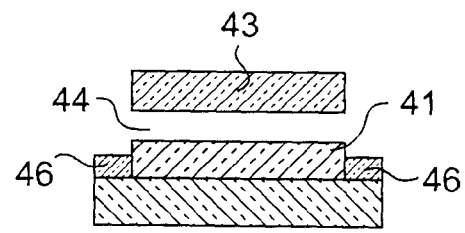

FIGS. 4A to 4C are illustrative of another alternative embodiment where the species intended to preserve the materials not to be etched and intended to solicit the etching species, is introduced in the form of a material present on the structure to be etched.

FIG. 4A shows a structure comprising a substrate 40 in silicon supporting epitaxied layers 41 in silicon, 42 in SiGe (this is the sacrificial layer) and 43 in silicon. The stack of layers 41, 42 and 43 leaves edges 45 subsisting on the substrate 40.

FIG. 4B shows the previous structure further comprising on the edges 45 of the substrate 40 a material 46 constituting a species having an affinity for the etching agent greater than that of layers 41 and 43 and less than that of the sacrificial layer. The material 46 may be an alloy of SiGe less rich in Ge than the alloy of the layer 42. Since the rate of etching increases with the percentage of Ge, the attacks occur firstly at the level of the layer 42, then at the level of the material 46 and does not occur on the layers 41 and 43 as long as the material 46 remains (see FIG. 4C).

Figure 5A:
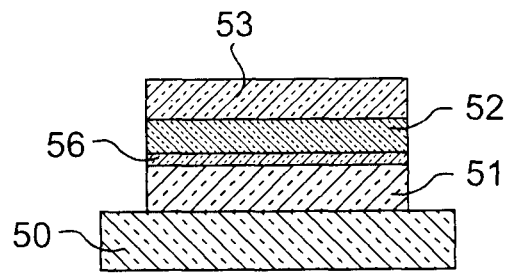
FIGS. 5A to 5C are illustrative of yet another alternative embodiment of the method according to the present invention.
Figure 5B:
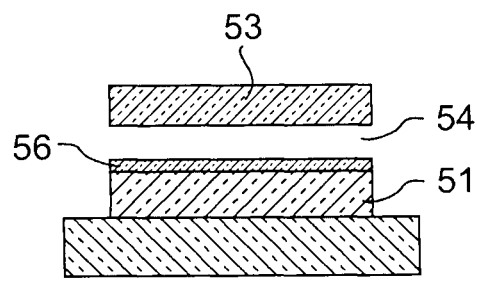
Figure 5C:
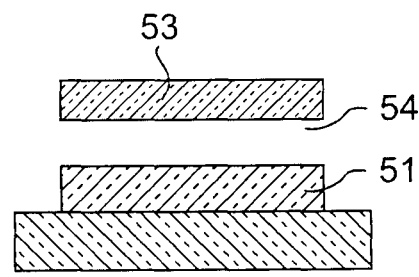

FIGS. 5A to 5C are illustrative of yet another alternative embodiment of the case where the species intended to preserve the materials not to be etched and intended to solicit the etching species, is introduced in the form of a material present on the structure to be etched.

FIG. 5A shows a structure comprising a substrate 50 in silicon supporting epitaxied layers 51 in silicon, 56 in a first alloy of SiGe, 52 in a second alloy of SiGe (this is the sacrificial layer) and 53 in silicon. The layer 56 of SiGe is less rich in Ge than the layer 52. The material of the layer 56 constitutes a species having an affinity for the etching agent greater than that of layers 51 and 53 and less than that of the sacrificial layer 52.

FIG. 5B shows the structure obtained after etching of the tunnel 54 and just before the etching of the layer 56. The etching may continue so as to leave only a residue of material 56 on the layer 51 (see FIG. 5C). The layer 56 may be conserved after the formation of the tunnel 54. Indeed, it absolutely does not interfere with the layer 53 that is normally the layer active, since it is deposited on the layer 51.

The invention claimed is:

1. A method of etching a sacrificial layer for a micromachined structure, the structure comprising a first silicon layer, the sacrificial layer in SiGe epitaxied on the first silicon layer and a second silicon layer epitaxied on the sacrificial layer, the method comprising:
    providing at least one species in SiGe which is less rich in Ge than the sacrificial layer, the species in SiGe being in the form of a material present on the structure and separated from the second silicon layer; and
    then, etching the sacrificial layer by an etching agent that is a gas containing fluorine, the etching being carried out to eliminate the sacrificial layer and then to at least partially eliminate said species.

2. An etching method according to claim 1, wherein the species is present on the structure in a form of a solid material.

3. An etching method according to claim 2, wherein the species is constituted of a material arranged near to the sacrificial layer.

4. An etching method according to claim 2, wherein the species is constituted of a layer of a material between the sacrificial layer and the first silicon layer.

* * * * *